United States Patent
Takeuchi

[19]

[11] Patent Number: 5,815,433

[45] Date of Patent: Sep. 29, 1998

[54] MASK ROM DEVICE WITH GATE INSULATION FILM BASED IN PAD OXIDE FILM AND/OR NITRIDE FILM

[75] Inventor: Nobuyoshi Takeuchi, Tokyo, Japan

[73] Assignees: NKK Corporation, Tokyo, Japan; Macronix International Co., Ltd., Hsinchu, Taiwan

[21] Appl. No.: 572,901

[22] Filed: Dec. 22, 1995

[30] Foreign Application Priority Data

Dec. 27, 1994 [JP] Japan .................................. 6-340543

[51] Int. Cl.[6] .............................. G11C 11/34; H01L 27/02
[52] U.S. Cl. .............. 365/182; 365/155.01; 365/185.09; 257/326; 257/390
[58] Field of Search .................................... 365/104, 103, 365/182, 185.09, 185.01; 257/390, 391, 316, 326

[56] References Cited

U.S. PATENT DOCUMENTS

| | | | |
|---|---|---|---|
| 4,942,450 | 7/1990 | Iwashita | 365/185.09 |
| 5,329,482 | 7/1994 | Nakajima | 365/182 |
| 5,337,274 | 8/1994 | Ohji | 365/185.01 |
| 5,383,162 | 1/1995 | Shirai | 365/231 |
| 5,400,278 | 3/1995 | Kunori | 365/182 |
| 5,455,438 | 10/1995 | Hashimoto | 257/391 |
| 5,493,139 | 2/1996 | Akiyama | 365/185.01 |

OTHER PUBLICATIONS

Prince, Betty, *Semiconductor Memories A Handbook of Design Manufacture and Application*, second edition, pp. v–xvii and pp. 764–773, published 1991 by John Wiley & Sons, West Sussex, England.

Primary Examiner—David C. Nelms
Assistant Examiner—Son Mai
Attorney, Agent, or Firm—Mark A. Haynes; Wilson, Sonsini, Goodrich & Rosati

[57] ABSTRACT

A cell portion 10 of a MOS structure and a redundant cell portion 12 of an MNOS structure are formed in a single semiconductor substrate. These MOS and MNOS structures commonly include an oxide film 26. A laminate structure consisting of a silicon nitride film and a pad oxide film and used in the element separation step is included in the redundant cell portion 12. Therefore, the redundant circuit can be naturally formed without increasing the number of process steps, leading to a high yield without inviting an increase in the manufacturing cost.

14 Claims, 9 Drawing Sheets

MASK ROM DEVICE WITH GATE INSULATION FILM BASED IN PAD OXIDE FILM AND/OR NITRIDE FILM

BACKGROUND OF THE INVENTION

1. Field of the Invention

The present invention relates to a nonvolatile semiconductor memory device and a method of manufacturing the same, particularly, to a mask ROM device and a method of manufacturing the same.

2. Description of the Related Art

In recent years, the capacity of a semiconductor memory is gradually increased. With increase in the memory capacity, defective bits have emerged as a big problem to be solved. Where there is a defect in the memory cell of, particularly, a mask ROM, it is impossible to use another memory cell as a substitute cell for electrically writing data. Therefore, it is said to be impossible to simply increase the rows or columns of cells to form a redundant circuit as in an EPROM.

In the conventional semiconductor memory, measures given below are taken against the above-noted difficulty:

(1) An ECC (Error Checking and Correction) circuit is incorporated into the semiconductor memory for dealing with the problem of the defective bit. Specifically, defective bits are detected and corrected in the ECC circuit, with the result that normal bits are generated from the ECC circuit.

(2) A redundant circuit portion is formed on a semiconductor device separately from the memory cell portion. A one polycrystalline silicon (polysilicon) layer-type EPROM cell column is formed in the redundant circuit portion to use the memory in the redundant circuit portion in place of the memory cell column corresponding to the defective bit.

The ECC circuit gives rise to a demerit that it is unavoidable for the device to occupy a large area. This demerit is being eliminated by various measures. However, the ECC circuit leaves room for further improvement in respect of the operating speed. Extensive efforts are expected to be made in the future for improving the operating speed of the ECC circuit.

Where one polysilicon layer-type EPROM is formed in a redundant circuit, it is unavoidable for the chip area to be increased, because the cell area in the one polysilicon layer-type EPROM is larger than that of the ROM cell.

SUMMARY OF THE INVENTION

An object of the present invention is to provide a mask ROM device and a method of manufacturing the same, which permits naturally forming a redundant circuit without increasing the process steps and which also permits increasing the yield without increasing the manufacturing cost.

In the present invention, the SiNx/Oxide structure used for the element separation is used as an MNOS structure. The problems inherent in the prior art are solved in the present invention by incorporating the SiNx/Oxide structure into a redundant circuit as an MNOS structure.

According to one aspect of the present invention, there is provided a mask ROM device, comprising:

a semiconductor substrate;

a memory cell portion formed on the semiconductor substrate such that columns of memory cells each having an MOS structure and being programmed are arranged to form an array; and a redundant circuit portion formed on the semiconductor substrate and including columns of redundant cells each having an MNOS structure;

wherein a gate oxide film included in the MOS structure is substantially equal in thickness to a gate oxide film included in the MNOS structure.

According to another aspect of the present invention, there is provided a method of manufacturing a mask ROM device, comprising the steps of:

forming a first oxide film on a semiconductor substrate, followed by forming a nitride film on the first oxide film;

selectively removing said nitride film and said first oxide film such that the remaining portions of the nitride film and first oxide film collectively form a laminate structure corresponding to an MNOS structure;

forming impurity regions corresponding to source and drain regions in a surface region of the semiconductor substrate;

forming a gate oxide film on that portion of the semiconductor substrate which forms a channel region positioned between the source and drain regions so as to form an MOS structure; and forming a gate electrode on each of the first oxide film and the gate oxide film.

In the present invention, an MNOS cell having an area substantially equal to that of an array cell can be incorporated into the mask ROM device without requiring addition of a special process step.

DETAILED DESCRIPTION OF THE PREFERRED EMBODIMENTS

Figure 1:
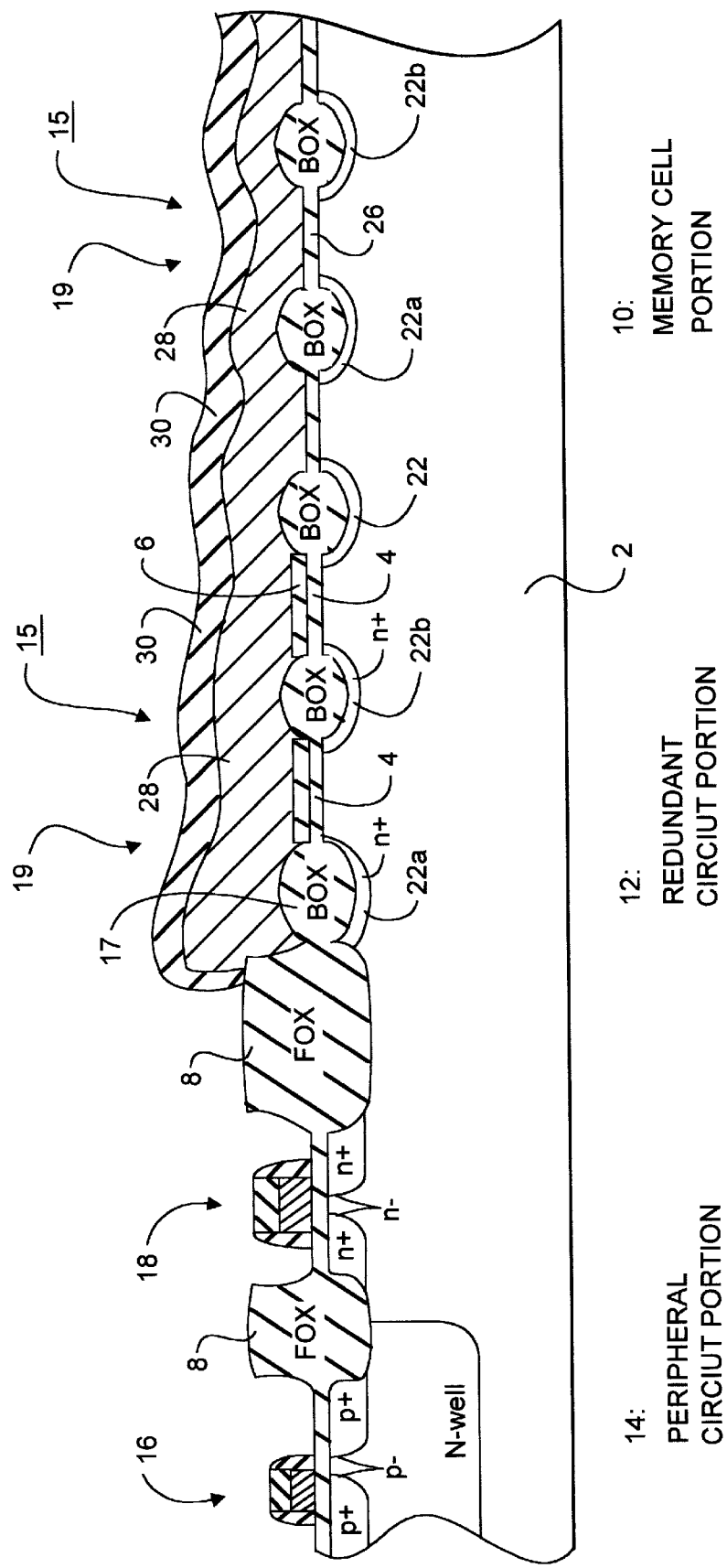
FIG. 1 is a cross sectional view showing the construction of a mask ROM device according to one embodiment of the present invention.

Let us describe the construction and manufacturing method of a mask ROM device according to one embodiment of the present invention with reference to the accompanying drawings. Specifically, FIG. 1 shows the construction of a mask ROM device according to one embodiment of the present invention. The mask ROM device shown in FIG. 1 is manufactured by the process steps shown in FIGS. 2A to 2F and 3A to 3F.

As shown in FIG. 1, the mask ROM device according to one embodiment of the present invention comprises a p-type silicon semiconductor substrate 2, a memory cell portion 10, a redundant circuit portion 12 and a peripheral circuit portion 14. These portions 10, 12 and 14 are formed on a surface region of the substrate 2. A nonvolatile memory cell, which can be used when any of the memory cells included in the memory cell portion 10 has become defective, is formed in the redundant circuit portion 12. The redundant circuit portion 12 is driven by the peripheral circuit portion 14 in which are formed complementary transistors of PMOS 16 and NMOS 18. The complementary transistors PMOS 16 and NMOS 18 formed in the peripheral circuit portion 14 collectively constitute a driving circuit, etc. These PMOS 16 and NMOS 18 are separated from each other by a field oxide film ($F_{OX}$) 8. Similarly, the peripheral circuit portion 14 is separated from the redundant circuit portion 12 and the memory cell portion 10 by additional field oxide film ($F_{OX}$) 8.

An MNOS 15 acting as an EEPROM is formed in the redundant circuit portion 12. Specifically, a buried oxide ($B_{OX}$) film 17 is formed in the semiconductor substrate 2. Further, $n^+$ impurity regions 22 acting as a source region 22a and a drain region 22b are formed below the buried oxide film 17. A channel region is defined in a substrate surface region between these source and drain regions 22a and 22b. Further, a pad oxide film 4 is formed on the surface region above the channel region. A silicon nitride film 6 is formed on the pad oxide film 4. Further, a gate electrode structure 19 consisting of a polycrystalline silicon (polysilicon) film 28 and a tungsten silicide film 30 formed on the polysilicon film 28 is formed on the pad oxide film 4 so as to form an MNOS structure 15. In writing data in the transistor of the MNOS structure, a writing voltage is applied to the gate electrode structure 19, with voltage kept applied between the source region 22a and the drain region 22b. Upon application of the writing voltage, electrons are trapped in the boundary between the pad oxide film 4 and the silicon nitride film 6 and, thus, the data is written. The threshold value of the MNOS structure is changed if data is written. Therefore, the channel region between the source region 22a and the drain region 22b is rendered conductive when read voltage is applied to the gate electrode structure 19 so as to read data.

An NMOS structure similar to the MNOS structure having the silicon nitride film 6 removed therefrom is formed in the memory cell portion 10. To be more specific, the buried oxide ($B_{OX}$) film 17 is formed in the semiconductor substrate 2 in each memory cell transistor included in the memory cell portion 10. An $n^+$ impurity region 22 is formed below the oxide film 17 to provide a source region 22a and a drain region 22b. The substrate surface region positioned between the source region 22a and the drain region 22b forms a channel region, and a gate oxide film 26 is formed on the surface of the channel region. Further, a gate electrode structure 19 consisting of the polysilicon film 28 and the tungsten silicide film 30 is formed to cover the gate oxide film 26.

In the memory cell portion 10, each memory cell is programmed in advance by using a mask in the manufacturing process as described herein later. Among various methods which can be employed for the programming of the cell, employed in this embodiment is a method of ion implantation into the semiconductor surface region for controlling the threshold value of the cell transistor. To be more specific, boron ions are implanted into the channel region of the cell transistor so as to enhance the threshold value of the cell transistor such that the channel is not rendered conductive with application of a reading voltage. The ion implantation is also called a core implantation. The logic "1" and "0" of the cell transistor is determined by the core implantation, as shown in Table 1 below:

TABLE 1

|  | Without core implantation | With core implantation |
|---|---|---|
| Cell threshold value | low | high |
| Logic | "0" | "1" |

In the general MNOS structure, the oxide film is formed thin, e.g., less than 3 nm or 5 nm thick. Since the oxide film is thin, a high voltage is applied to the gate in writing data so as to allow a tunnel current to flow through the oxide film. In the MNOS structure according to one embodiment of the present invention, however, the pad oxide film 4 is formed relatively thick, as apparent from the manufacturing method described herein later. In the MNOS structure having a relatively thick pad oxide film 4, hot electrons and hot holes are injected into the boundary between the pad oxide film 4 and the silicon nitride film 6 so as to write or erase data. To be more specific, the threshold value of the cell transistor is increased and decreased by electron injection and hole injection, respectively. Depending on cases, the cell transistor can be made negative, i.e., state of depletion transistor. In this fashion, the MNOS structure shown in FIG. 1 permits forming three states of "high", "low" and "no charge injection". The logic [0, 1], which consists of two states, is selected from among these three states. Therefore, there are three kinds of the logic. As can be readily understood, any of the hole injection or electron injection is selected in view of the balance of the cell transistor depending on the relationship between the initial state of "no injection" and the logic [0, 1] of the cell transistor.

However, the hole injection takes time in general. Therefore, it is practical to select the electron injection. Specifically, the lowermost logic state shown in Table 2 below is said to be most desirable.

TABLE 2

|  | Hole injection | No injection | Electron injection |
|---|---|---|---|
| Cell threshold value | low | middle | high |
| Logic | 0 | 1 | — |
|  | 0 | — | 1 |
|  | — | 0 | 1 |

FIGS. 2A to 2F collectively show how to manufacture the mask ROM device shown in FIG. 1.

Figure 2A:
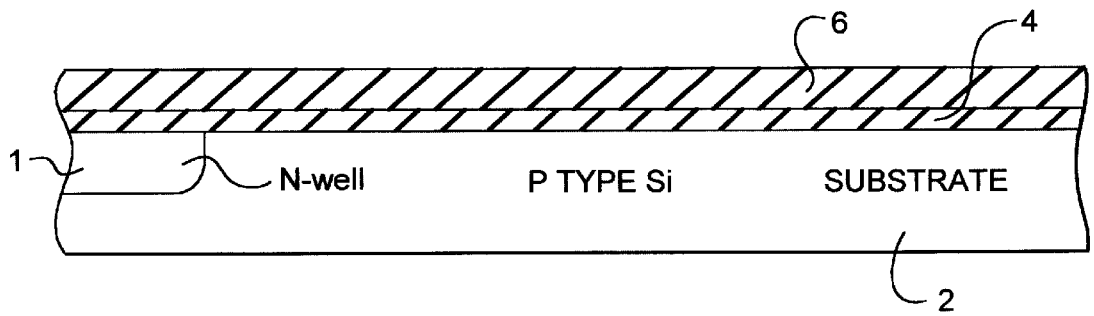
FIGS. 2A to 2F are cross sectional views collectively showing former steps of manufacturing the mask ROM device shown in FIG. 1.

In the first step, an N-well 1, i.e., an n-type semiconductor region, is formed in a surface region of a p-type silicon substrate 2, as shown in FIG. 2A. For forming the N-well 1, a silicon dioxide ($SiO_2$) film is formed under an oxygen gas atmosphere of 900° C. on the (100) plane of the p-type substrate 2 having a resistivity of 8 to 12Ω·cm, followed by forming a resist pattern with photolithography. Then, phosphorus ions are implanted under an energy of 150 keV and at a concentration of $7.5 \times 10^{12}/cm^2$ into the substrate 2 having the resist pattern formed thereon. After the ion implantation, the resist pattern is removed, followed by annealing at 1150° C. for about 6 hours so as to activate the implanted ions and, thus, to form n-type semiconductor region 1 (or N-well). After the annealing step, the silicon dioxide film is removed by RCA washing process including a treatment with hydrogen fluoride (HF).

Then, a silicon dioxide film 4 for buffering, i.e., a pad oxide film, is formed in a thickness of 15 nm on the entire surface of the substrate 2 having the N-well 1 formed therein. A mixed gas consisting of an oxygen gas ($O_2$) and a hydrogen chloride gas (HCl) and heated to 900° C. is used for forming the silicon dioxide film 4. Further, a silicon nitride film 6 is formed in a thickness of 50 nm on the silicon dioxide film 4 by LPCVD (Low pressure Chemical Vapor Deposition) method using a mixed gas consisting of an ammonia gas ($NH_3$) and dichlorosilane gas ($SiH_2Cl_2$) and heated to 770° C.

Figure 2B:
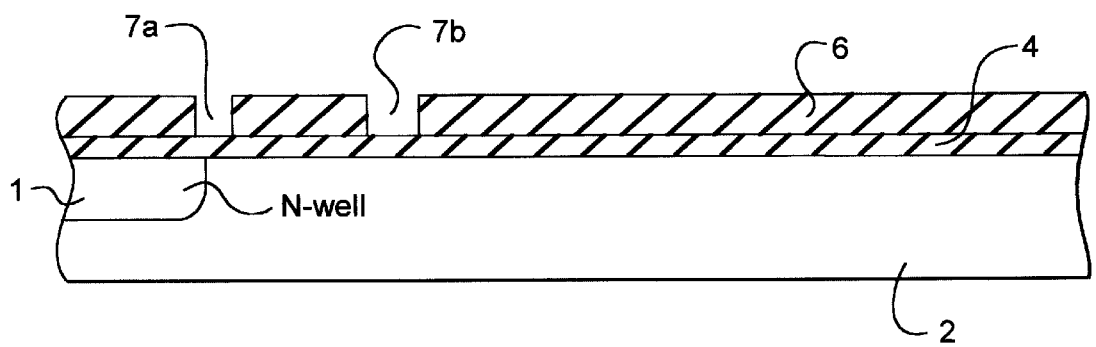
Figure 2C:
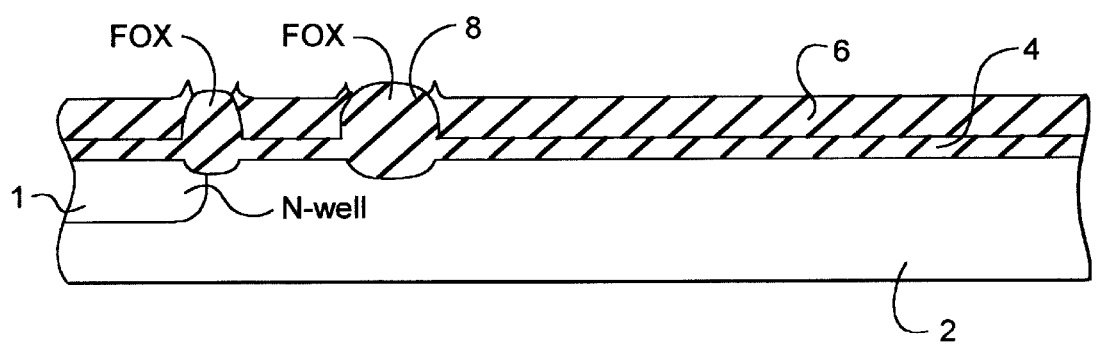

Then, a resist pattern is formed on the silicon nitride film 6 by photolithography, followed by selectively removing the silicon nitride film 6 by RIE (reactive ion etching) to form openings 7a and 7b selectively exposing the pad oxide film 4, as shown in FIG. 2B. A mixed gas of $SF_6$/He is used for the RIE. Further, the exposed portions 7a, and 7b of the pad oxide film 4 are oxidized with an $O_2/H_2$ mixed gas heated to 980° C. to form field oxide films 8 each having a thickness of 500 nm, as shown FIG. 2C. As described previously, the peripheral circuit portion 14 are separated from the redundant circuit portion 12 and the memory cell portion 10 by these field oxide films 8. Further, p-type regions and n-type regions are separated from each other by the field oxide film 8 in the peripheral circuit portion 14.

Figure 2D:
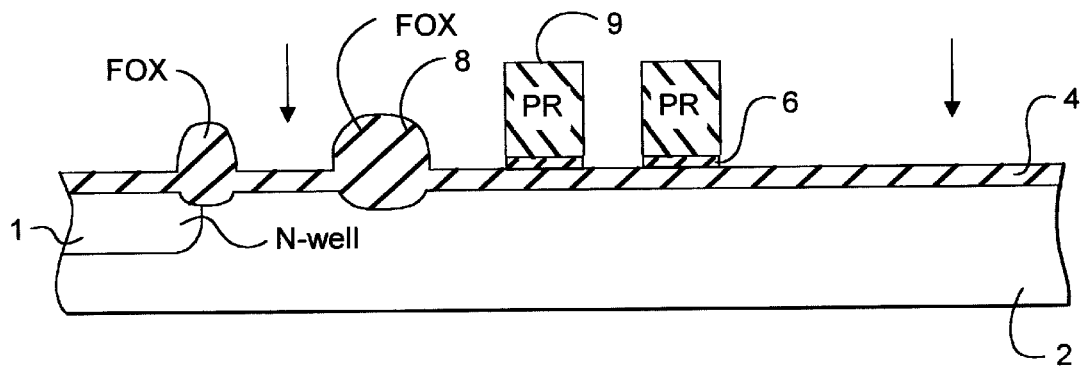

After formation of the field oxide films 8, impurity ions are implanted through the pad oxide film 4 into the substrate 2 in order to control the threshold value of a transistor formed later. Specifically, a resist mask 9 is formed on the silicon nitride film 6, followed by selectively removing that portion of the silicon nitride film 6 which is not covered with the resist mask 9 by RIE using a mixed gas of $SF_6$/He, as shown in FIG. 2D. Under this condition, impurity ions are implanted through the pad oxide film 4 into the surface region of the substrate 2. In the patterning of the ion implantation mask, that portion of the silicon nitride film 6 which is positioned in the redundant circuit portion 12 is covered with the photoresist film 9. As a result, the channel length of the memory cell in the redundant circuit portion 12 is defined by the photoresist film 9. Further, the concentration of the implanted ions, e.g., B ions, which controls the threshold value, is set substantially at $10^{11}$ to $10^{13}/cm^2$, though the concentration is controlled appropriately depending on the desired characteristics of the transistor.

After the ion implantation step, the photoresist film 9 is removed, followed by thermally oxidizing the surface of the semiconductor substrate 2 at 875° C. under an oxygen gas ($O_2$) atmosphere so as to form a sacrificial silicon oxide film 20 having a thickness of 20 nm on the surface of the substrate 2.

Figure 2E:
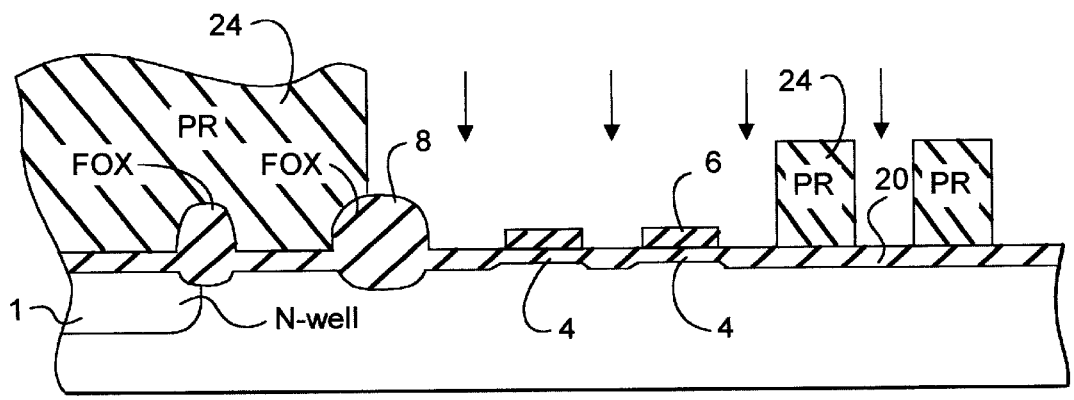

In the next step, a resist pattern 24, which is used in the subsequent step as a mask for ion implantation, is formed as shown in FIG. 2E by photolithography in preparation for formation of a buried diffusion layer. The resist pattern 24 is formed to cover the peripheral circuit portion 14 and to selectively cover the memory cell portion 10. In the subsequent ion implantation step, the silicon nitride film 6 patterned previously is used as a mask in the redundant circuit portion 12 together with the resist pattern 24. Then, arsenic ions are implanted under energy of 60 keV into surface regions of the semiconductor substrate 2 at a dose of $3\times10^{15}/cm^2$ so as to form $n^+$ diffusion layers 22, i.e., source region 22a and drain region 22b, as shown in FIG. 2F.

Figure 2F:
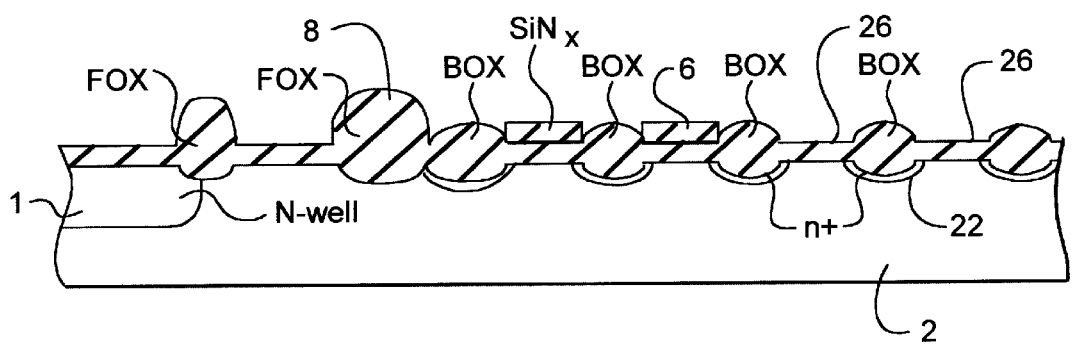

The sacrificial oxide film 20 formed previously to cover the surface of the substrate 2 is removed by BOE (Bufferd Oxide Etching) method, followed by oxidizing the surface region of the substrate 2 to form a gate oxide film 26 having a thickness of 18 nm, as shown in FIG. 2F. The gate oxide film 26 is formed at 875° C using a mixed gas of $O_2$/HCl.

Figure 3A:
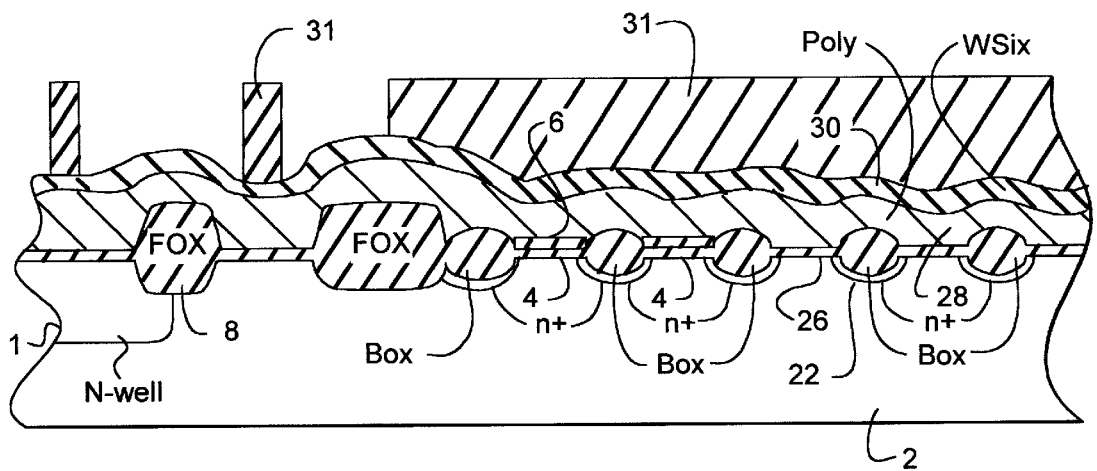
FIGS. 3A to 3F are cross sectional views collectively showing latter steps of manufacturing the mask ROM device shown in FIG. 1.

In the next step, polycrystalline silicon (polysilicon) is deposited by LPCVD method at 630° C. using a silane gas ($SiH_4$) on the entire surface to form a polysilicon film 28 having a thickness of 150 nm, as shown in FIG. 3A. The resultant polysilicon film 28 is doped with phosphorus (P) at 875° C. using phosphorus oxychloride ($POCl_3$) as a dopant. The doping level should be about $40\Omega/cm^2$ in terms of the sheet resistance level of the silicon single crystal wafer. The resistance of the polysilicon film 28 is lowered by the phosphorus doping. Further, tungsten silicide is deposited at 430° C. by CVD method to form a tungsten silicide film 30 having a thickness of 200 nm on the polysilicon film 28.

Figure 3B:
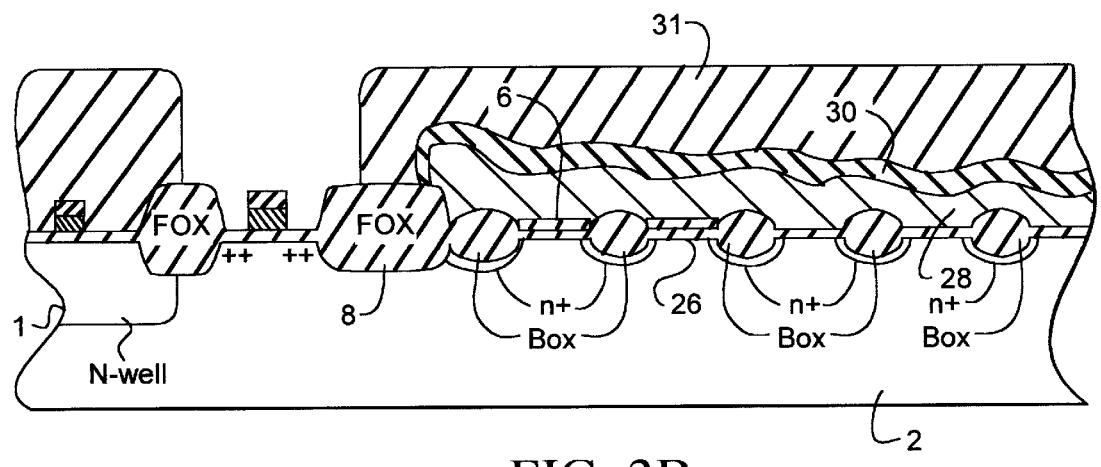

After formation of the tungsten silicide film 30, a gate take-out process is carried out by, for example, RIE. Specifically, a photoresist film 31 formed on the tungsten silicide film 30 is patterned by photolithography to selectively expose the tungsten silicide film 30 as shown in FIG. 3A. Then, the exposed portion of the tungsten silicide film 30 is removed by etching with a $SF_6$/HBr mixed gas with the patterned photoresist film 31 used as a mask, as shown in FIG. 3B. Further, the polysilicon film 28 positioned below the removed portion of the tungsten silicide film 30 is removed by etching with a $HBr/Cl_2$ mixed gas, with the resultant patterned laminate structure consisting of the photoresist film 31 and the tungsten silicide film 30 used as a mask. Further, the silicon nitride film 6 of inter-word-line area positioned in the redundant circuit portion 12 is removed by etching with a fluoropropane ($C_3F_8$) gas, thereby forming the redundant circuit portion 12 and the memory cell portion 10 of the mask ROM device shown in FIG. 1.

Figure 3C:
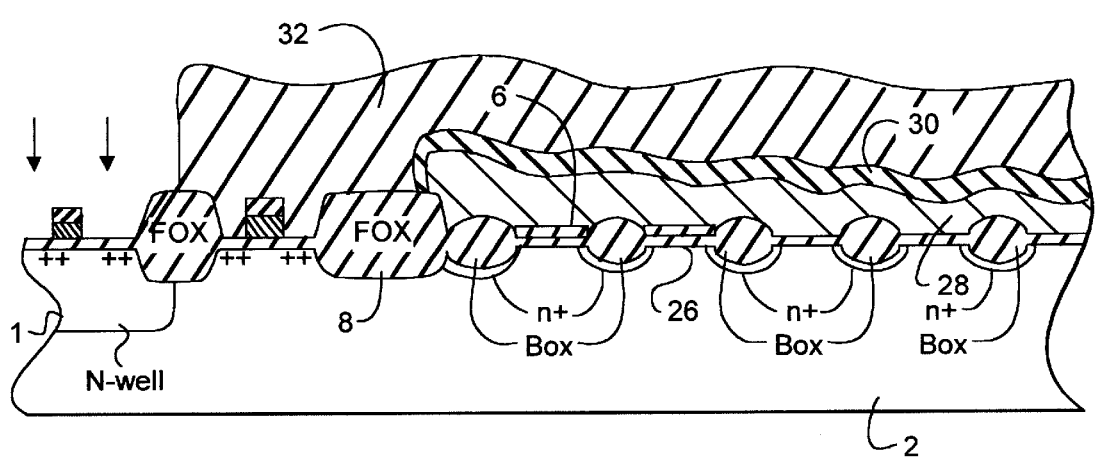

In the gate gate electrode patterning process shown in FIGS. 3A and 3B, the memory cell portion 10 is formed and, at the same time, the tungsten silicide film 30 and the polysilicon film 28 in the peripheral circuit portion 14 are removed by etching. Then, source and drain regions of a transistor in the peripheral circuit portion 14 are formed as shown in FIGS. 3B and 3C. Specifically, an $n^-$ impurity such as phosphorus ions is implanted at an energy of 60 keV into the substrate 2 with a dose of about $2\times10^{13}/cm^2$ for preparation of an n-channel transistor, as shown in FIG. 3B. Then, the photoresist film 31 is removed. Next, the photoresist film pattern 32 is formed, as shown in FIG. 3C, followed by implanting a $p^-$ impurity such as boron difluoride ($BF_2$) ions at an energy of 60 keV into the substrate 2 at a dose of about $1\times10^{13}/cm^2$ for preparation of a p-channel transistor in the peripheral circuit portion 14, as shown in FIG. 3C.

Figure 3D:
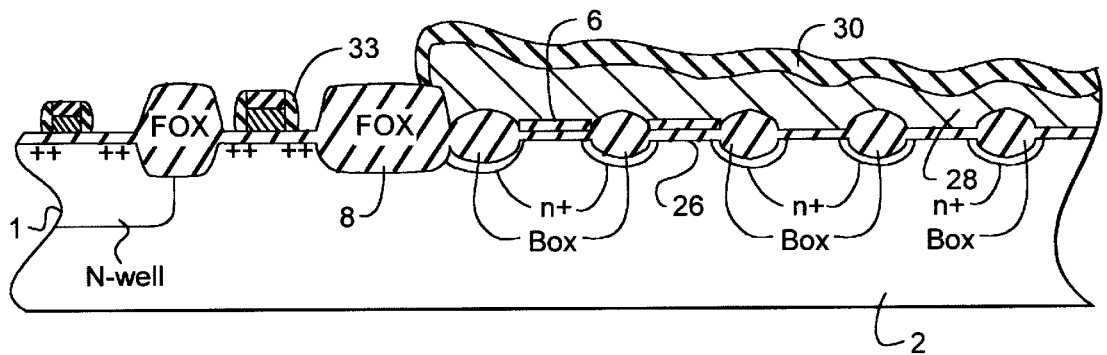
Figure 3E:
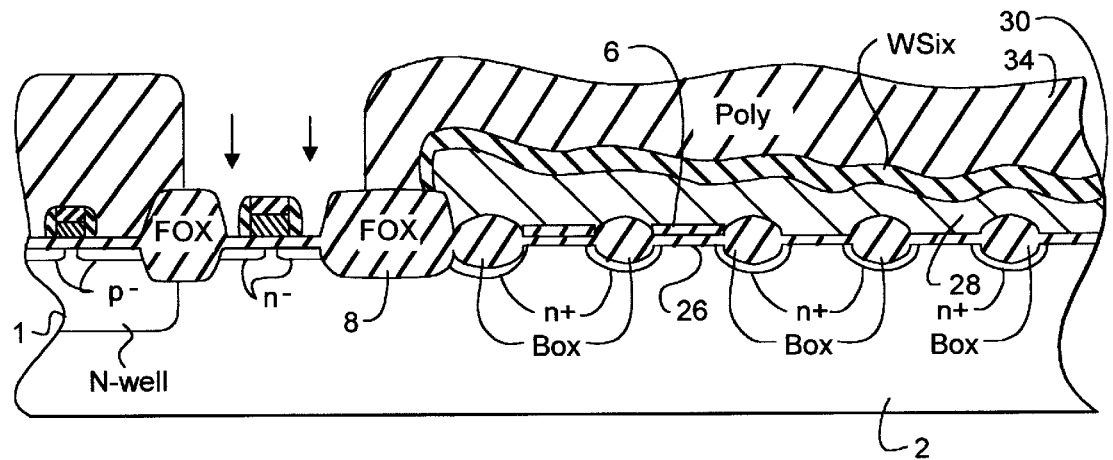
Figure 3F:
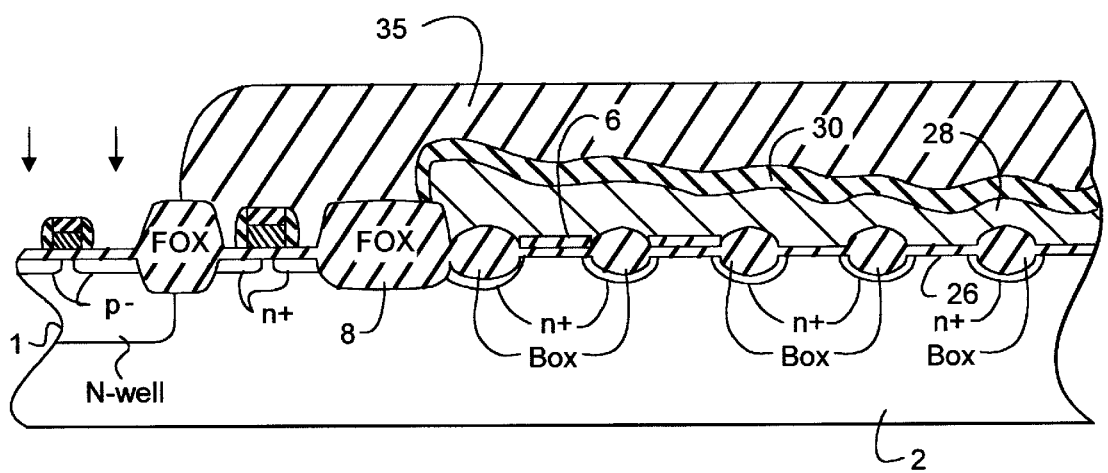

In the next step, the remaining photoresist film 32 is removed, followed by forming a silicon dioxide film at 700° C. in a thickness of 300 nm by LPCVD in preparation for formation of a spacer 33, as shown in FIG. 3D. The resultant silicon dioxide film is anisotropically etched by RIE with a mixed gas of $Ar/CF_4/CHF_3$ to form the spacer 33. Further, a resist mask 34 is formed, followed by implanting an $n^+$ impurity such as arsenic ions into the substrate 2 with an energy of 80 keV and at a dose of about $3\times10^{15}/cm^2$, as shown in FIG. 3E. Still further, $P^+$ impurity such as boron difluoride ($BF_2$) ions is implanted into the substrate 2 with an energy of 70 keV and at a dose of about $3\times10^{15}/cm^2$ by using a resist mask 35 so as to form a transistor circuit in the peripheral circuit portion 14. Incidentally, the ion implantation for field separation can be performed simultaneously with the ion implantation for forming the source and drain regions of the peripheral NMOS transistor. To be more specific, boron ions can be implanted with an energy of 180 keV and at a dose of $2\times10^{12}/cm^2$ for the field separation by using the mask used for the ion implantation for preparation of the source-drain regions noted above.

As a punch-through stopper for the buried diffusion layer 22, an ion implantation for the punch-through stopper can be performed after the ion implantation into the buried diffusion layer 22. Of course, the ion implantation for the punch-through stopper can be employed in combination with various techniques. For example, the ion implantation process for determining the threshold value Vt can be performed in two steps. In this case, the ion implantation in the latter step can be employed as an ion implantation for punch-through stopper for the peripheral circuit portion in combination with the ion implantation for punch-through stopper for the buried diffusion layer 22.

Figure 4:
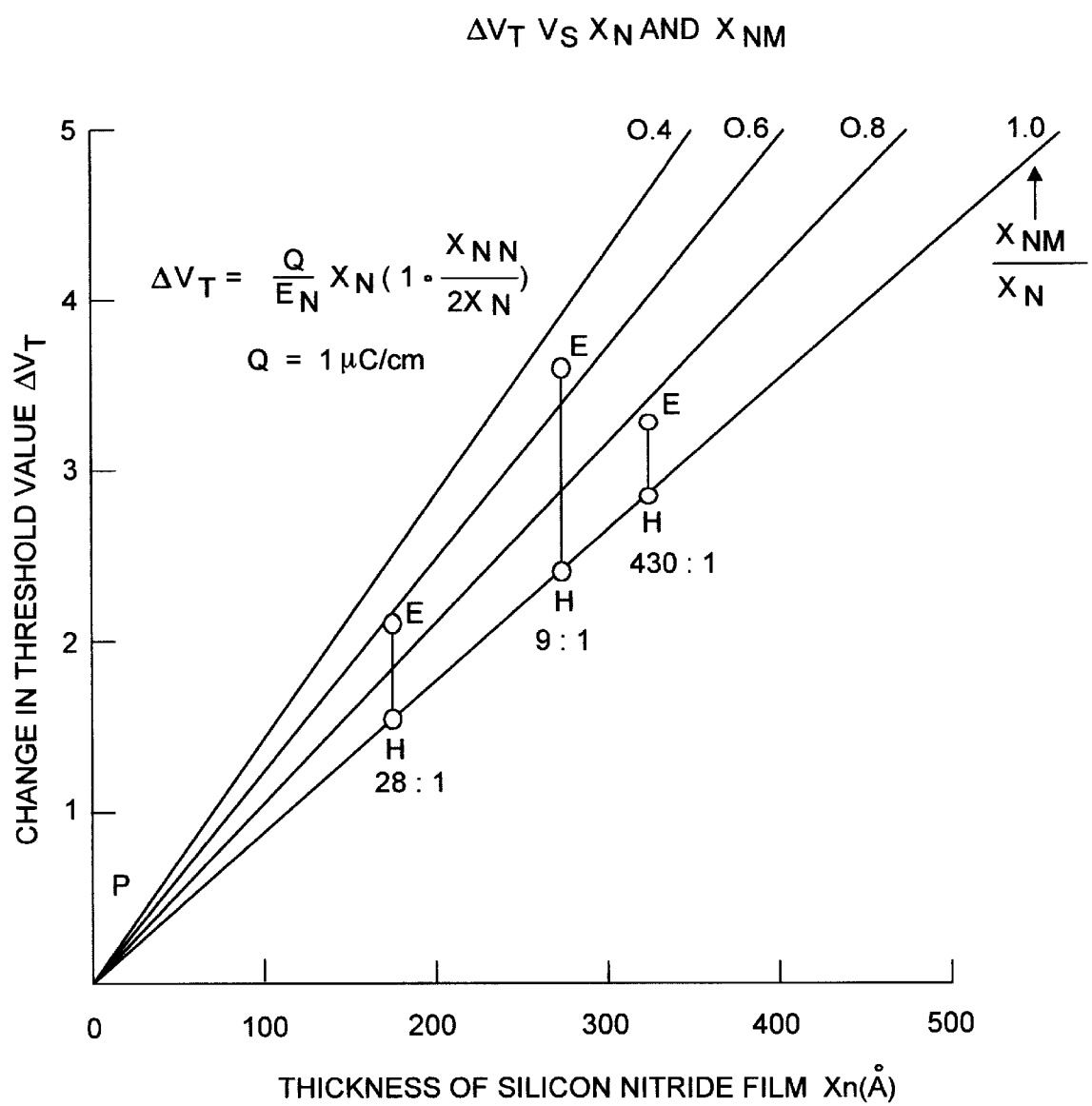
FIG. 4 is a graph showing the change in the threshold value caused by electron injection relative to the thickness of a silicon nitride film, covering the case where the charge is $1\mu C/cm^2$.

Concerning the device design of the MNOS portion, attentions should be paid to, for example, an article on MNOS devices by F. L. Hampton and J. R. Cricchi reported in IEDM '79. Described in this article is the relationship among the silicon nitride film thickness, change in threshold value caused by electron injection, and the conditions for forming the silicon nitride film, as shown in FIG. 4.

Since the cell programming is performed on the basis of electron injection, as already described, the silicon nitride film is formed relatively thin and an ion implantation into the MNOS portion for determining the threshold value is not employed in the present invention so as to suppress the threshold value of the MNOS portion.

Figure 5A:
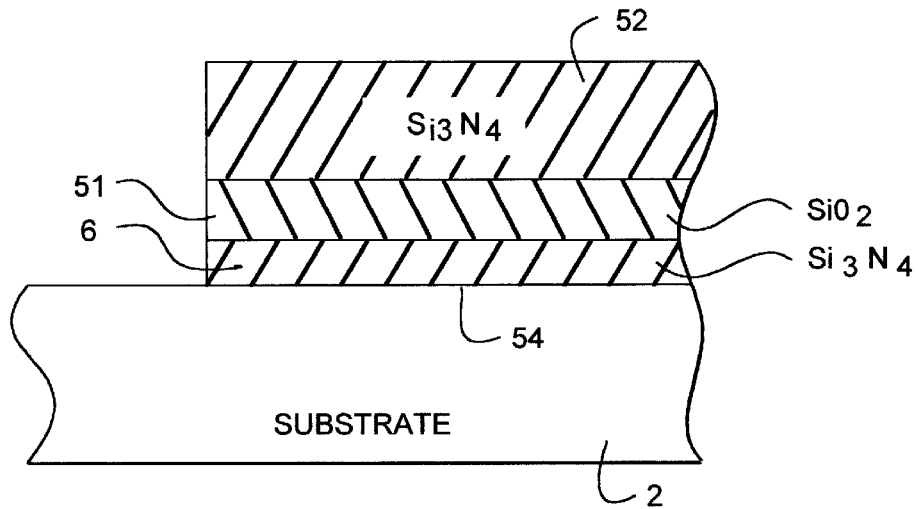
FIGS. 5A to 5D are cross sectional views showing the steps of manufacturing a mask ROM device according to a modification of the present invention employing a SILO semiconductor structure.

In the case of employing SILO (Sealed Interface Local Oxidation) structure for the element separation, the redundant circuit portion 12 can be designed more easily. Specifically, the silicon nitride film 6 is formed substantially in direct contact with the surface of the silicon substrate 2 in the SILO structure, as shown inn FIG. 5A. Further, a laminate structure consisting of a silicon dioxide film 51 and a silicon nitride film 52 is formed on the silicon nitride film 6. In general, a native oxide film 54 is formed on the surface of the substrate 2. The silicon nitride film 6 noted above is formed on the native oxide film 54. The native oxide film 54 may be replaced by a very thin thermal oxide film 54 in the subsequent step. Specifically, a thermal oxide film 54 is formed in a thickness of at most 5 nm, if the substrate 2 is put in an LPCVD furnace under a reduced pressure immediately after cleaning of the substrate surface with hydrogen fluoride. In the present invention, the thermal oxide film 54 is formed at 800° C. in a thickness of at most 5 nm by LPCVD under an oxygen gas atmosphere, followed by depositing the silicon nitride film 6 on the thermal oxide film 54. The silicon nitride film 6 is formed in a thickness of 30 nm at 780° C. by LPCVD using a mixed gas of $NH_3$/$SiH_2Cl_2$. Since the MNOS structure formed in the subsequent steps in the redundant circuit portion 12 is a laminate structure consisting of the nitride film 6 and the very thin oxide film 54, the effective thickness, i.e., thickness in terms of the thickness of an oxide film, of the laminate structure can be made in this step to conform with the thickness of the gate oxide film 26 formed in the subsequent step.

Figure 5B:
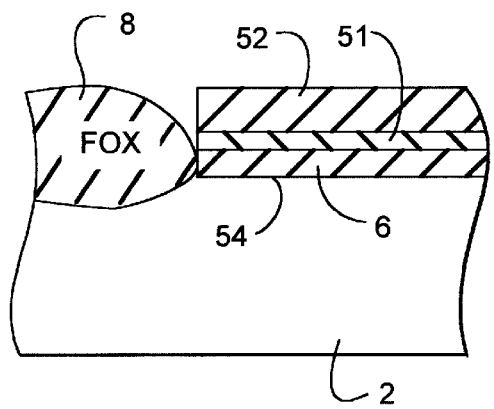
Figure 5C:
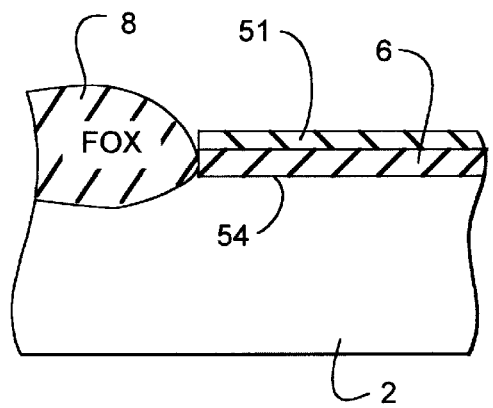
Figure 5D:
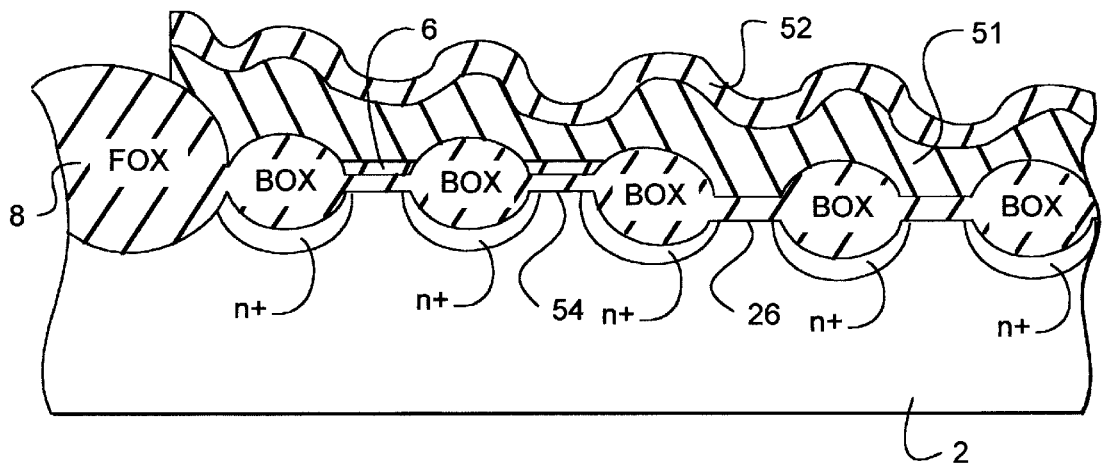

After formation of the silicon nitride film 6, a silicon dioxide film 51 and a silicon nitride film 52 are formed successively on the silicon nitride film 6 by LPCVD method, followed by patterning the laminate structure consisting of the native oxide film 54, nitride film 6, oxide film 51 and nitride film 52. After the patterning, a thick field oxide film ($F_{OX}$) 8 is formed by field oxidation, as shown in FIG. 5B. In forming the silicon nitride film 52, an LPCVD treatment is performed by using a mixed gas of $N_2O$/$SiH_4$ at 780° C. to form a silicon nitride film in a thickness of 70 nm. The subsequent patterning step is performed by RIE using a fluorocarbon gas such as a $C_3F_6$ gas or a $C_4F_8$ gas. When it comes to a SILO structure, the films forming a laminate structure are removed one by one by means of etching with fluorine, phosphoric acid, fluorine and, then, phosphoric acid. In the present invention, however, an MNOS structure is employed, with the result that some films are left unremoved, as shown in FIG. 5C. Further, a mask ROM device shown in FIG. 5D is formed by applying the steps shown in FIGS. 2E to 2F and FIGS. 3A to 3F. In the MNOS structure formed by these steps, the oxide film formed on the first silicon nitride film is required to be very thin such that the particular film will be removed in the step of removing the sacrificial oxide film formed before formation of the gate oxide film 26. To be more specific, the thickness of the oxide film in question must practically be not greater than 100 nm, preferably not greater than 50 nm, even if the greatest reduction in the thickness of the field oxide film is taken into account. On the other hand, when used as a mask in the step of ion implantation into the buried diffusion region, the silicon dioxide film formed on the first silicon nitride film is required to be at least 20 nm thick. Incidentally, the thickness is not particularly defined in the silicon nitride film 52, i.e., the uppermost film of the laminate structure.

As described above, employment of the SILO structure, which requires a multi-layer process, produces a merit that the nitride film included in the MNOS structure can be made optimum in view of the desired characteristics. Also, in the embodiment shown in the accompanying drawings, a tunnel current can be used for writing data into the MNOS structure as in the ordinary writing process. Further, where the abovenoted processes can be employed, an element separation method using a second oxide film and a second nitride film such as SWAMI (Side Wall Masked Isolation) method can also be employed in addition to the SILO method.

In the mask ROM device of the construction described above, the core implantation into the memory cell portion 10 can be performed in any of the steps given below:

(1) The core implantation into the memory cell can be performed in the step of FIG. 2F before formation of the tungsten silicide film 30 and the polysilicon film 28.

(2) The core implantation into the memory cell can be performed in the step of FIG. 3A immediately after formation of the tungsten silicide film 30 and the polysilicon film 28.

(3) The core implantation into the memory cell can be performed in the step of FIG. 3B after patterning of the tungsten silicide film 30 and the polysilicon film 28, or after formation of the structure shown in FIG. 1.

(4) The core implantation into the memory cell can be performed after formation of BPSG and metal layer formation.

Additional methods of core implantation into the memory cell, which are generally employed in this technical field, can also be employed in the present invention.

Figure 6:
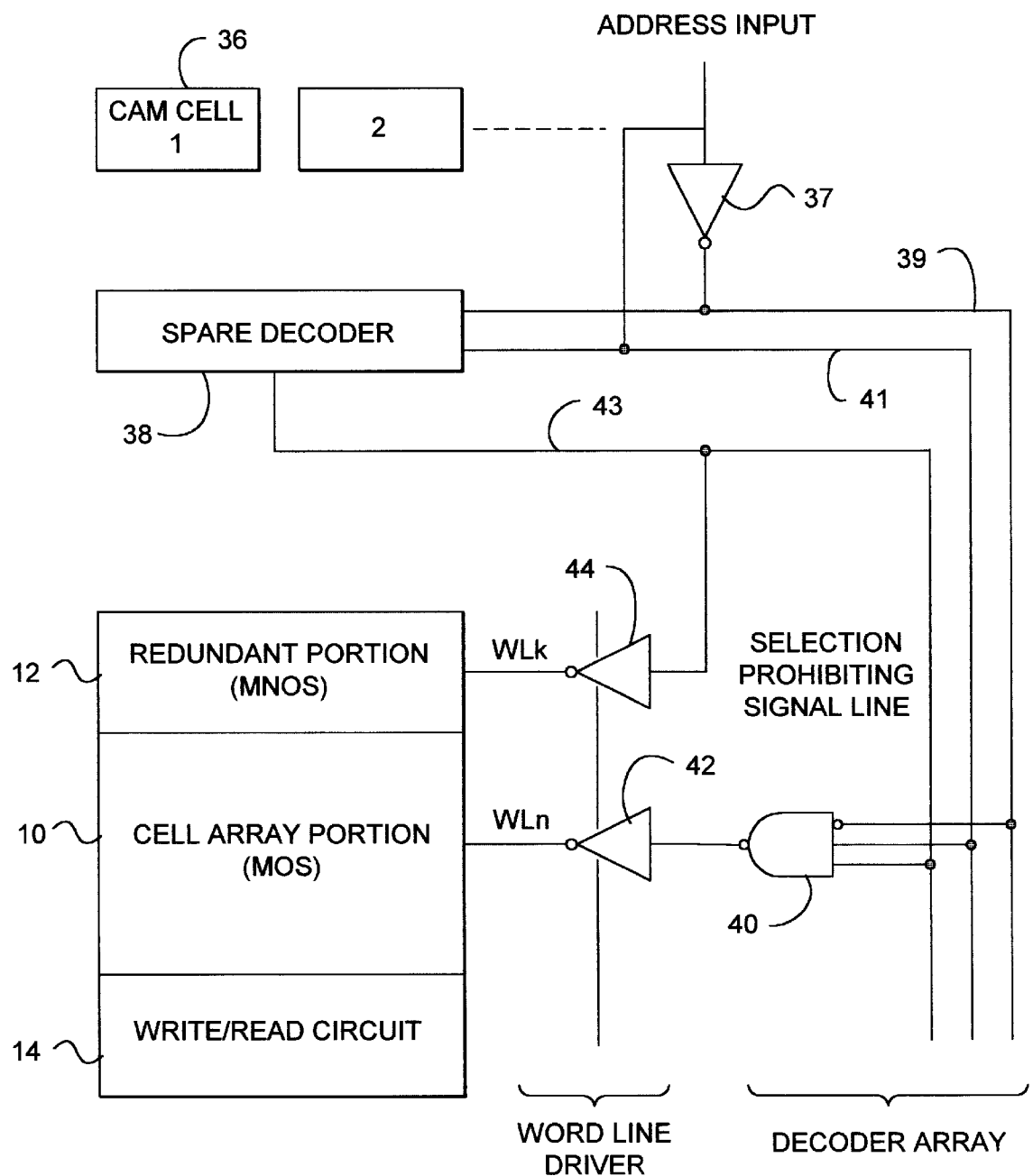
FIG. 6 is a block diagram showing the construction of a circuit for selecting a word line of a redundant circuit portion in place of a word line of a cell array portion in a mask ROM device of the present invention.

FIG. 6 exemplifies a circuit diagram around the memory cell including the redundant circuit. In this circuit, where there is a defect in the cell connected to a word line WLn of the cell portion 10, a word line WLk of the redundant circuit 12 is selected as a spare of the word line WLn. In other words, where a defective cell is included in the cell portion 10, the word line WLk of the redundant circuit 10 is used in place of the word line WLn connected to the defective cell.

In the circuit shown in FIG. 6, the contents of a CAM (Content Addressable Memory) cell 36 are referred to by the redundant circuit 12 every time an address signal is input. Where the input address coincides with the address stored in the CAM cell 36, the cell designated by the address is handled as a defective cell. To be more specific, the circuit is constructed such that, when an address signal accessing a defective cell is input, a spare decoder 38 decodes the program of the CAM cell 36 so as to select the word line of the redundant circuit 12. As a result, selection of the word line WLn connected to the defective cell is inhibited so as to select the word line WLk of the redundant circuit. Incidentally, the CAM cell 36 is of an MNOS structure like the redundant circuit portion.

If an address for selecting a cell, e.g., "1", is supplied to an inverter 37, "0" is generated from the inverter 37, with the result that signals "0" and "1" are supplied through array decoder lines 39, 40, respectively, into the spare decoder 38. In accordance with the address signal, the spare decoder 38 decodes the program of the CAM cell 36. Where a defect is not included in the selected word line WLn, a selection signal "1" is supplied from the spare decoder 38 to an array decoder line 43. Where a defect is included in the word line WLn, however, a non-selection signal "0" is supplied from the spare decoder 38 to an array decoder line 43.

Where a defect is not included in the word line WLn, output signals "0", "1" and "1" are supplied through array decoder lines 39, 41, 43, respectively, to a NAND circuit 40. The signal"0" on the line 39 is inverted to "1" when supplied to the NAND circuit 40, with the result that a signal "0" is generated from the NAND circuit 40. The output from the NAND circuit 40 is supplied to a NOT circuit 42 connected to a word line driver. A voltage high enough to select the word line WLn is generated from the NOT circuit 42 so as to select the word line WLn. On the other hand, a selection signal "1" is supplied through the array decoder line 43 to a NOT circuit 44. In this case, however, the word line WLk connected to the redundant circuit 12 is not selected because the output from the NOT circuit 44 is "0".

Where a defect is included in the word line WLn, output signals "0", "1" and "0" are supplied through array decoder lines 39, 41, 43, respectively, to the NAND circuit 40. As a result, an output "1" is generated from the NAND circuit 40. The output from the NAND circuit 40 is supplied to the NOT circuit 42 connected to the word line driver. In this case, output "0" for not selecting the word line WLn is generated from the NOT circuit 42. On the other hand, a non-selection signal "0" is supplied through the array decoder line 43 to the NOT circuit 44. In this case, the word line WLk connected to the redundant circuit 12 is selected because the output from the NOT circuit 44 is "1".

In writing data, a bit line BL is selected by using a writing circuit (not shown) in a cell column selected via the word line WLn of the redundant circuit 12. In this case, hot electrons are injected into a designated cell so as to program the cell column.

In reading data, the bit line BL is selected by using a reading circuit (not shown) in the cell column selected via the word line WLn of the redundant circuit 12, as in the writing step, to read data from the cell.

Figure 7A:
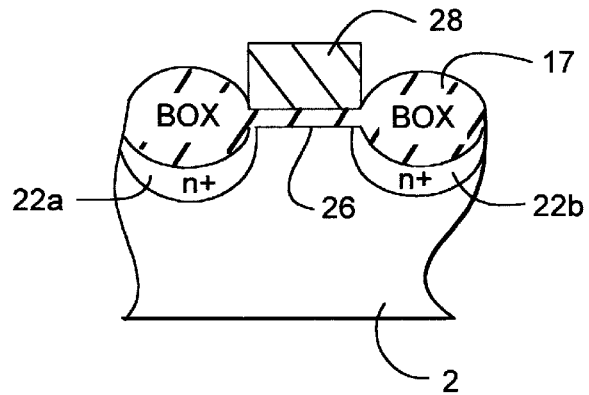
FIGS. 7A, 7B and 7C are cross sectional views showing the constructions of a MOS memory cell, an EEPROM and MNOS, respectively.

In a semiconductor device comprising a memory cell array of an MNOS structure as a redundant circuit, an additional circuit such as an error checking-correcting circuit need not be included in the semiconductor device, making it possible to simplify the circuit construction. Also, the cell itself can be diminished, making it possible to suppress the area of the redundant circuit itself to a minimum level. 5 Further, the redundant circuit can be formed in the process of manufacturing a mask ROM device without increasing the steps of the manufacturing process. To be more specific, where there is a defect in the memory cell of a MOS structure constructed as shown in FIG. 7A, the conventional semiconductor device must be constructed to include an error checking-correcting circuit for inspecting the defect of the memory cell and correcting data to data of a normal memory regardless of being a defective cell. However, such an error checking-correcting circuit need not be incorporated into the semiconductor device of the present invention, leading to miniaturization of the semiconductor device.

Figure 7B:
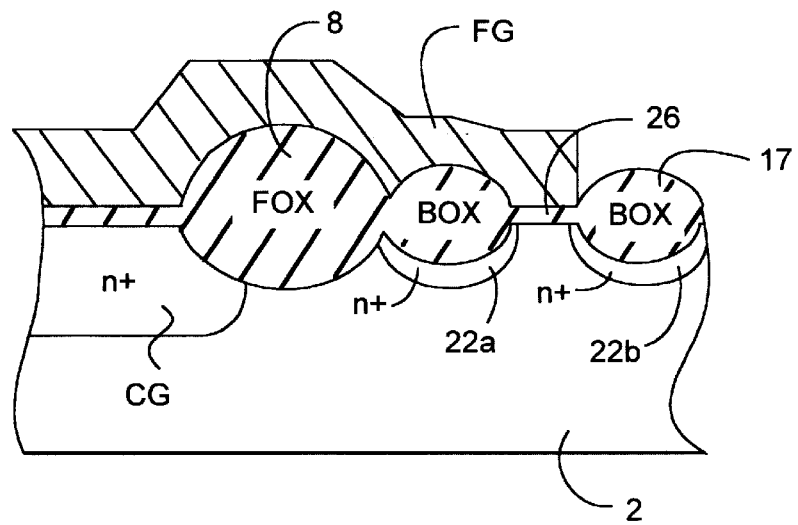
Figure 7C:
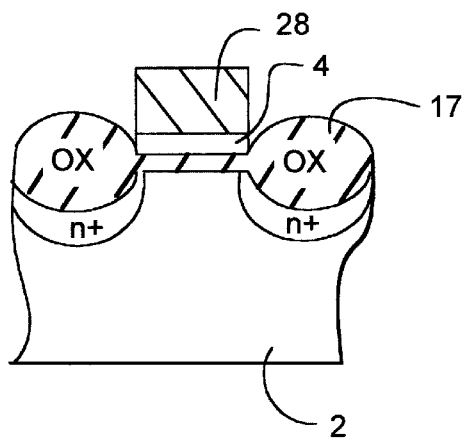

When it comes to a semiconductor device having a one polysilicon type EPROM incorporated therein as a redundant circuit, as shown in FIG. 7B, the area occupied by the device on a substrate is rendered larger than that of a memory cell of a MOS structure as shown in FIG. 7C. Clearly, the construction shown in FIG. 7B fails to make the semiconductor device compact. Specifically, the construction including the source region 22a, the drain region 22b, and the gate oxide film 26, which are shown in each of FIGS. 7A and 7C, is included in the semiconductor device shown in FIG. 7B. In the EPROM shown in FIG. 7B, however, a floating electrode FG consisting of a polysilicon layer extends to cover a buried oxide film 17 and a field oxide film 8. The floating electrode FG further extends to cover an oxide film on an impurity region acting as a control gate CG. It follows that the redundant circuit portion cannot be made sufficiently compact in the EPROM shown in FIG. 7B. On the other hand, the NMOS structure shown in FIG. 7C can be made substantially as compact as the mask ROM device shown in FIG. 7A.

In the present invention directed to a mask ROM device and a method of manufacturing the same, a silicon nitride film and a pad oxide film used in the step of forming an element separation region are used as they are to constitute an MNOS structure. Therefore, a redundant circuit can be naturally formed without increasing the number of process steps, leading to a high yield without inviting an increase in the manufacturing cost.

What is claimed is:

1. A mask ROM device, comprising:
   a semiconductor substrate having a pad oxide film formed on a surface thereof and element separation regions formed in the surface oxide of said pad oxide film serving as a base material of said element separation regions;
   a memory cell portion including an array of programmed MOS memory cells formed on the semiconductor substrate; and
   a redundant circuit portion including MNOS redundant cells formed on the semiconductor substrate;
   wherein each of said MNOS redundant cells has a gate insulator containing a part of the pad oxide film which is located between corresponding element separation regions.

2. A mask ROM device, comprising:
   a semiconductor substrate having a pad oxide film formed on a surface thereof and element separation regions formed in the surface, oxide of said pad oxide film serving as a base material of said element separation regions;
   a memory cell portion including an array of programmed MOS memory cells formed on the semiconductor substrate; and
   a redundant circuit portion inducting MNOS redundant cells formed on the semiconductor substrate;

wherein each of said MNOS redundant cells has a gate insulator containing a part of the pad oxide film which is located between corresponding element separation regions, and an insulating film covering the part of the pad oxide film, and each of said MOS memory cells has a gate insulator made of an oxide film which is other than said pad oxide film and which is located between corresponding element separation regions.

3. The mask ROM device according to claim 2, wherein said insulating film contains a part of a nitride film formed on the pad oxide film and defining positions of said element separation regions.

4. A mask ROM device, comprising:
a semiconductor substrate having a pad oxide film formed on a surface thereof and element separation regions formed in the surface, oxide of said pad oxide film serving as a base material of said element separation regions;
a memory cell portion including an array of programmed MOS memory cells formed on the semiconductor substrate; and
a redundant circuit portion including MNOS redundant cells formed on the semiconductor substrate;
wherein each of said MNOS redundant cells has a gate insulator made of a part of the pad oxide film which is located between corresponding element separation regions, and a nitride film covering the part of the pad oxide film.

5. The mask ROM device according to claim 4, further comprising a peripheral circuit portion having MOS cells formed on said semiconductor substrate;
wherein each of said MOS cells has a gate insulation film made of an oxide film which is other than said pad oxide film and which is located between corresponding element separation regions.

6. The mask ROM device according to claim 4, wherein each memory cell has a gate insulator made of an oxide film which is other than said pad oxide film and which is located between corresponding element separation regions.

7. The mask ROM device according to claim 5, wherein a peripheral circuit portion is electrically isolated from said redundant circuit portion by the element separation regions located therebetween.

8. The mask ROM device according to claim 4, wherein each of said MOS memory cells is programmed by implantation of impurity ions into a part of the surface of said semiconductor substrate which is located between the source and drain regions thereof.

9. A mask ROM device, comprising:
a semiconductor substrate having a pad oxide film formed on a surface thereof and element separation regions formed in the surface, oxide of said pad oxide film serving as a base material of said element separation regions;
a memory cell portion including an array of programmed MOS memory cells formed on the semiconductor substrate;
a redundant circuit portion including MNOS redundant cells formed on the semiconductor substrate; and
a peripheral circuit portion electrically isolated from said redundant circuit portion by the element separation regions located therebetween;
wherein each of said MNOS redundant cells has a gate insulator containing a part of the pad oxide film which is located between corresponding element separation regions, and each of said MOS memory cells has a gate insulator made of an oxide film which is other than said pad oxide film and which is located between corresponding element separation regions.

10. The mask ROM device according to claim 9, wherein the gate insulator of each MNOS redundant cell contains a nitride film covering said pad oxide film.

11. The mask ROM device according to claim 9, wherein said peripheral circuit portion having MOS cells including a gate insulator made of an oxide film which is other than said pad oxide film and which is located between corresponding element separation regions.

12. The mask ROM device according to claim 10, wherein said peripheral circuit portion having MOS cells including a gate insulator made of an oxide film which is other than said pad oxide film and which is located between corresponding element separation regions.

13. The mask ROM device according to claim 9, wherein said MNOS redundant cells are programmed by injection of hot electrons.

14. The mask ROM device according to claim 10, wherein said MNOS redundant cells are programmed by ijection of hot holes.

* * * * *